(12) United States Patent
Visokay et al.

(10) Patent No.: US 6,797,599 B2
(45) Date of Patent: Sep. 28, 2004

(54) GATE STRUCTURE AND METHOD

(75) Inventors: Mark R. Visokay, Richardson, TX (US); Antonio L. P. Rotondaro, Dallas, TX (US); Luigi Colombo, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/232,124

(22) Filed: Aug. 30, 2002

(65) Prior Publication Data

US 2003/0045080 A1 Mar. 6, 2003

Related U.S. Application Data

(60) Provisional application No. 60/316,669, filed on Aug. 31, 2001.

(51) Int. Cl.[7] ................. H01L 21/3205; H01L 21/4763

(52) U.S. Cl. ................ 438/586; 438/216; 438/261; 438/287; 438/585; 438/591; 438/785; 438/786

(58) Field of Search ................. 438/586, 216, 438/261, 287, 585, 591, 785, 786, 906; 427/126.4

(56) References Cited

U.S. PATENT DOCUMENTS 6,020,243 A * 2/2000 Wallace et al. ............ 438/287
6,395,650 B1 * 5/2002 Callegari et al. .......... 438/785

* cited by examiner

*Primary Examiner*—George Fourson
*Assistant Examiner*—Julio J. Maldonado
(74) *Attorney, Agent, or Firm*—Carlton H. Hoel; W. James Brady; Frederick J. Telecky, Jr.

(57) ABSTRACT

A MOSFSET structure with high-k gate dielecttrics for silicon or metal gates with gate dielectric liquid-based oxidation surface treatments prior to gate material desposition and gate formation.

8 Claims, 5 Drawing Sheets

GATE STRUCTURE AND METHOD

CROSS-REFERENCE TO RELATED APPLICATIONS

This application claims priority from provisional applications: Serial No. 06/316,669, filed Aug. 31, 2001. The following patent applications disclose related subject matter: Ser. No. 10/349,686, filed Jan. 23, 2003. These applicattions have a common assignee with the present application.

BACKGROUND OF THE INVENTION

The invention relates to electronic semiconductor devices, and, more particularly, to gate structures and fabrication methods for integrated circuits.

The trend in semiconductor integrated circuits to higher device densities by down-scaling structure sizes and operating voltages has led to silicon field effect (MOS) transistor gate dielectrics, typically made of silicon dioxide, to approach thicknesses on the order of 1–2 nm to maintain the capacitive coupling of the gate to the channel. However, such thin oxides present leakage current problems due to carrier tunneling through the oxide. Consequently, alternative gate dielectrics with greater dielectric constants to permit greater physical thicknesses have been proposed. Indeed, $Ta_2O_5$, $(Ba,Sr)TiO_3$, and other high dielectric constant materials have been suggested, but such materials have poor interface stability with silicon.

Wilk and Wallace, Electrical Properties of Hafnium Silicate Gate Dielectrics Deposited Directly on Silicon, 74 Appl. Phys. Lett. 2854 (1999), disclose measurements on capacitors with a hafnium silicate dielectric formed by sputtering (at a pressure of $5 \times 10_{-4}$ Torr and substrate temperature of 500° C.) a 5-nm thick layer of $Hf_6Si_{29}O_{65}$ directly onto silicon together with a gold top electrode deposited on the silicate dielectric. Such capacitors showed low leakage current, thermal stability, an effective dielectric constant of about 11, and a breakdown field of 10 MV/cm.

However, such silicate dielectrics need better electrical properties for use in high volume production silicon integrated circuits.

SUMMARY OF THE INVENTION

The invention provides silicon-based integrated circuits and fabrication methods for high-k gate dielectrics including a liquid-based oxidation treatment.

This has the advantages of enhanced electrical performance for high-k dielecttrics.

BRIEF DESCRIPTION OF THE DRAWINGS

The drawing are heuristic for clarity.

DESCRIPTION OF THE PREFERRED EMBODIMENTS

1. Overview

Preferred embodiment fabrication methods include liquid-based oxidation treatment of a metal silicate gate dielectric prior to deposition of gate electrode material. Particular gate dielectrics include compositions approximating (if stoichiometric) $Hf_xSi_{1-x}O_2$ and $Zr_xSi_{1-k}O_2$ ($0 \leq x \leq 1$) plus nitrides of these such as $Hf_wSiO_yN_z$ where the ratio of O to N may be roughly in the range of 10:1 to 1:1. Dielectric deposition may be by sputtering using an oxygen or nitrogen atmosphere, chemical vapor deposition with various precursors or atomic layer deposition. After dielectric deposition, an exposure to a solution of $H_2O_2$ provides an improvement in leakage current of the dielectric. Possibly some oxidation of the dielectric, including some oxygen displacement of nitrogen, cures defects in the dielectric and leads to the electrical characteristic improvements.

2. High-k Metal-Si-oxynitride Gate Dielectric Preferred Embodiments

FIGS. 1a–1f illustrate in cross sectional elevation views the steps of first preferred embodiment fabrication methods for integrated circuits including field effect transistors (e.g., CMOS or BiCMOS) with high-k gate dielectrics and polysilicon gates. The preferred embodiments include the following steps:

(1) Substrate

Figure 1A:
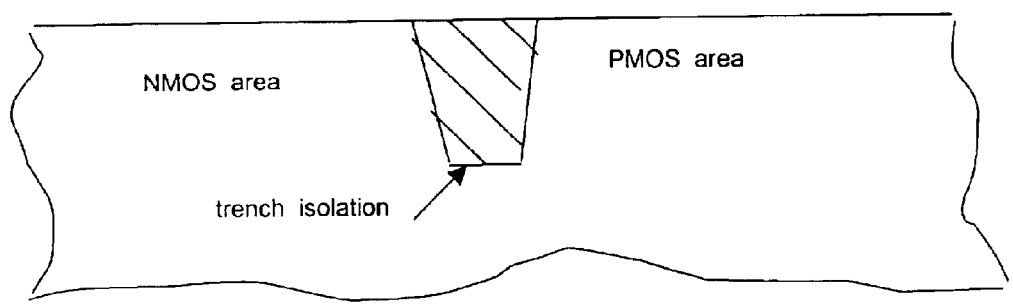
FIGS. 1a–1f are cross sectional elevation views of steps of a preferred embodiment integrated circuit fabrication method.

Start with a p-type silicon (or silicon-on-insulator) wafer with <100> orientation and form shallow trench isolation by pad oxide growth, nitride deposition, trench pattern, nitride-oxide-silicon trench etch, trench surface oxidation, trench fill by blanket oxide deposition, etch-CMP planarization, and nitride strip. FIG. 1a is a cross-sectional elevation view of the substrate illustrating the trench isolation and locations for fabrication of NMOS and PMOS transistors. Next, perform multiple dopant implants to form n- and p-type wells (plus, optionally, memory cell array wells and bipolar device buried layers) plus form channel stop regions, punch-through deterrence regions, and threshold adjust regions. These implants are performed through the residual pad oxide. During NMOS transistor location implants the PMOS areas are masked off; and a similar NMOS-masked implant occurs in the PMOS locations. Note that the implant doses and depths may differ for memory cell array transistors as compared to peripheral transistors. Also, both high and low voltage transistors of the same type may be formed and may have different implant doses and depths. A rapid thermal anneal (e.g., 1050° C. for 30 s) activates and diffuses the implanted dopants (e.g., boron and phosphorus).

(2) Surface Preparation

Prior to gate dielectric formation, the surface of the substrate from step (1) is cleaned, including removal of any residual silicon dioxide, with a last dilute HF rinse. A thin silicon dioxide layer may be re-grown prior to deposition of the high dielectric constant layer. The prepared substrate is then put into a vacuum deposition chamber; optionally surface contaminants are desorbed by heating. The desorption can take place in the deposition chamber or in another chamber, and the wafer then transferred to the deposition chamber under controlled ambient.

(3) Gate Dielectric Deposition

Figure 1B:
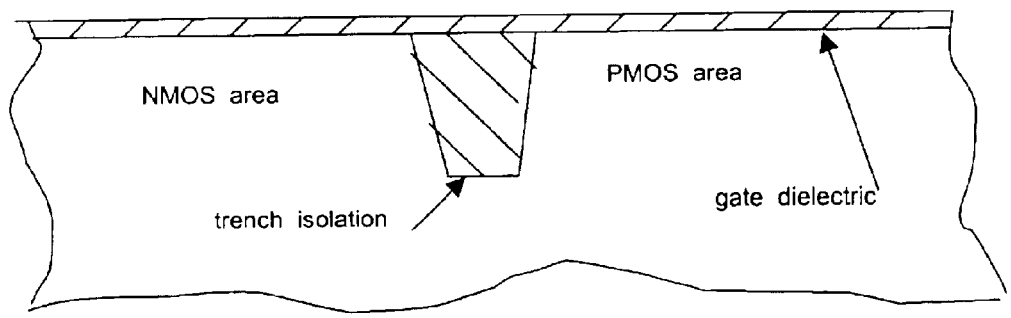
Figure 1C:
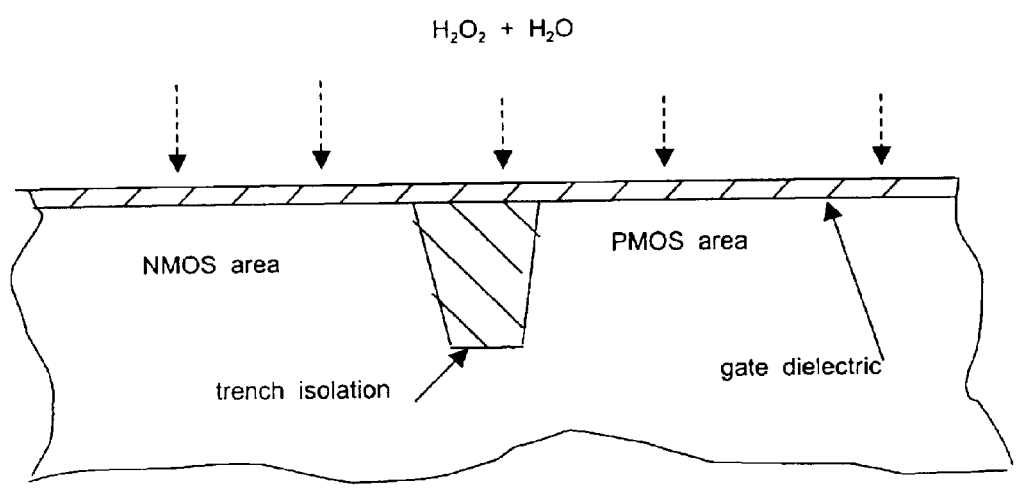
Figure 1D:
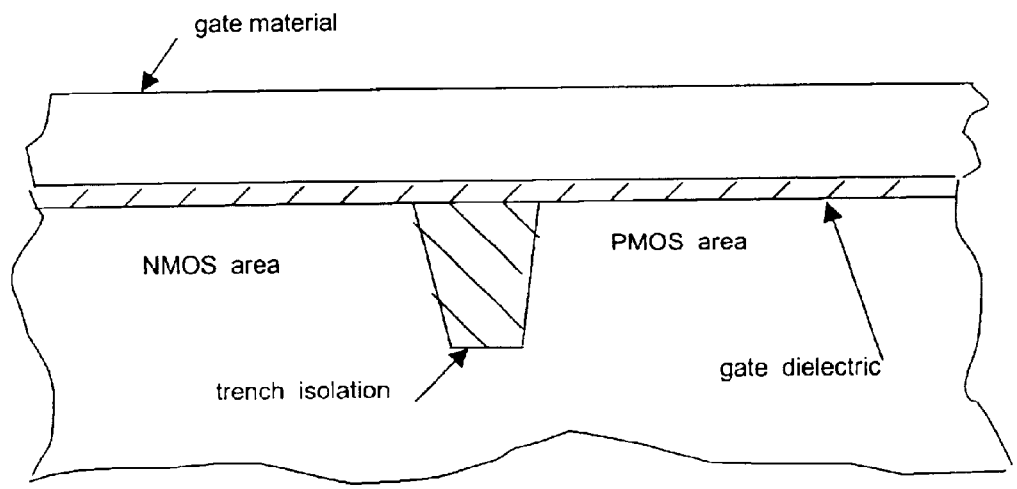

Deposit the gate dielectric onto the substrate from step (2); a variety of possible deposition methods exist (CVD, PVD, etc). Preferably, use a sputtering process comprising a $Hf_{0.5}Si_{0.5}$ target and a nitrogen-containing plasma to deposit a dielectric of composition roughly $Hf_{13.4}Si_{22.2}O_{33.1}N_{31.3}$ (XPS data from experiments) that is, a ratio of cations to anions of roughly 1 to 2 as in $SiO_2$ and $HfO_2$. This deposition of this metal silicon oxynitride results in an effective dielectric constant of about 14, so a 7 nm thick silicate nitride has an equivalent silicon dioxide thickness (EOT) of 2 nm but not the leakage (tunneling) current of such a thin silicon dioxide gate dielectric. It should be noted that the dielectric film does not necessarily need to contain nitrogen to benefit from the current invention. See FIG. 1b illustrating the gate dielectric layer on both the silicon areas and the shallow trench isolation.

(4) Split Gate Option

Various integrated circuits include both high voltage and low voltage transistors; that is, MOS transistors with differing operating voltages such as differing maximum source-drain voltages and gate-source voltages. For example, high voltage transistors could be used for peripheral transistors or programmable transistors, and low voltage transistors used for central processor or memory array transistors to limit power consumption and heat generation. High voltage MOS transistors require a thicker gate dielectric than low voltage MOS transistors in order to avoid breakdown. A modification of the foregoing step (3) can provide for two or more transistor gate dielectric thicknesses through various approaches. For example, first grow a thin silicon dioxide layer; next, strip this oxide layer in areas for low voltage transistors; then perform the passivation and high-k dielectric deposition of step (3) with the thickness of this dielectric layer targeted for the low voltage transistors. The remnant initial grown oxide under the high-k dielectric in the areas for high voltage transistors provides the required extra dielectric thickness.

(5) High-k Gate Dielectric Liquid-based Oxidation

The $Hf_{3.4}Si_{22.2}O_{33.1}N_{31.3}$ gate dielectric layer deposited in step (3) or (4) may have defects such as oxygen vacancies (and incorporated carbon if deposited by CVD with organic precursors) which can lead to large leakage currents. The preferred embodiments oxidize the high-k oxynitride dielectric layer, but rather than a gas phase oxygenation (such as oxygen-bearing plasmas or thermal treatment in oxygen containing ambients), a liquid-based chemistry oxidation is used. In particular, immerse the high-k coated substrate into a water solution of 5% by volume $H_2O_2$ at 65° C. for 7 minutes; see FIG. 1c. This provides low temperature and limited oxidation and avoids $SiO_2$ growth at the high-k oxynitride-Si interface, which would degrade the overall dielectric constant. The hot $H_2O_2$ treatment also leads to some replacement of nitrogen by oxygen in the dielectric (again XPS data for experimental compositions):

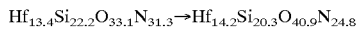
$$Hf_{13.4}Si_{22.2}O_{33.1}N_{31.3} \rightarrow Hf_{14.2}Si_{20.3}O_{40.9}N_{24.8}$$

The cation to anion ratio remains about 1 to 2, and the measured effective oxide thickness remains about 1.3 nm, but the leakage current drops.

After the liquid-based oxidation, anneal the substrate in an inert ($N_2$) atmosphere at 1000° C. for 60 sec. This anneal somewhat further improves the electrical characteristics of the high-k metal-Si oxynitride dielectric; possibly by further curing defects. It may also be desirable to perform the $N_2$ atmosphere anneal prior to the $H_2O_2$ treatment.

For the split gate option (4), the high-k gate dielectric is deposited on both silicon (low voltage devices) and silicon dioxide (high voltage devices). Experimentally, liquid-based oxidation of $Hf_{6.9}Si_{24.7}O_{44.5}N_{23.9}$ deposited on a thin silicon dioxide layer also showed nitrogen replacement by oxygen and improved electrical characteristics similar to that of the high-k oxynitride on silicon. In particular, for $Hf_wSi_xO_yN_z$ on thin silicon dioxide, the hot $H_2O_2$ drove the reaction:

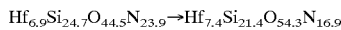
$$Hf_{6.9}Si_{24.7}O_{44.5}N_{23.9} \rightarrow Hf_{7.4}Si_{21.4}O_{54.3}N_{16.9}$$

The compositions are again from XPS data.

Alternative liquid-based oxidation may use any chemical mixture that provides active oxygen to the high-k film. For example acidic mixtures like: $H_2SO_4+H_2O_2+H_2O$, $H_2SO_4+H_2O$, $HNO_3+H_2O$, $HNO_3+H_2O_2+H_2O$, $HCl+H_2O_2+H_2O$; alkaline mixtures like: $NH_4OH+H_2O_2+H_2O$; neutral solutions like: $H_2O+O_3$ and solvents with the appropriate formulation. The liquid-based treatment can be performed in conventional immersion tanks or on spray tools where the chemicals are sprayed onto the wafer surface.

As a comparison, experiments with deposited $Hf_wSi_xO_yN_z$, without the liquid-based oxidation but with an anneal in a $N_2$ atmosphere or at 700° C. in an $O_2$ atmosphere for 60 seconds showed that the improvement in electrical characteristics due to the liquid-based oxidation could not be duplicated. In fact, annealing in an $O_2$ atmosphere did not effectively replace nitrogen in the $Hf_wSi_xO_yN_z$ but rather apparently grew silicon dioxide at the dielectric-Si interface and thereby increased the effective oxide thickness.

Further, the nitrogen fraction of the gate dielectric could be reduced to 0, but the liquid-based oxidation would still improve electrical characteristics due to defect reduction, or in the case of CVD films, carbon removal.

(6) Gate Material Deposition

Deposit a layer of polysilicon gate material of thickness <200 nm on the treated high-k gate dielectric from step (5). The deposition may be decomposition of silane. Then dope the gate material n$^+$ and p$^+$ type in the NMOS and PMOS areas, respectively, by non-critical photoresist masking and dopant implantations. (Polysilicon emitters for npn bipolars would be in the n$^+$ type area.) See FIG. 1d. Alternative gate materials such as metals and/or metal suicides, oxides or nitrides could be used, but two different metals may be needed to match the optimal NMOS and PMOS gate work functions.

(7) Gates

Spin on a layer of photoresist which is sensitive to deep ultraviolet; optionally, an antireflective coating (ARC) layer could be deposited prior to the photoresist in order to limit interference effects during photoresist exposure. The composition of the ARC and thickness are selected according to the exposure wavelength and the reflectivity of the underlying material. Expose the photoresist through a reticle for gates and gate level interconnects; the exposed minimal linewidth may be about 50 nm. Lastly, develop photoresist and strip exposed ARC, if any.

Use the patterned photoresist as an etch mask for the anisotropic plasma etch of polysilicon to form gates and gate level interconnects. The gate material could also provide a polysilicon emitter for bipolar devices.

Figure 1E:
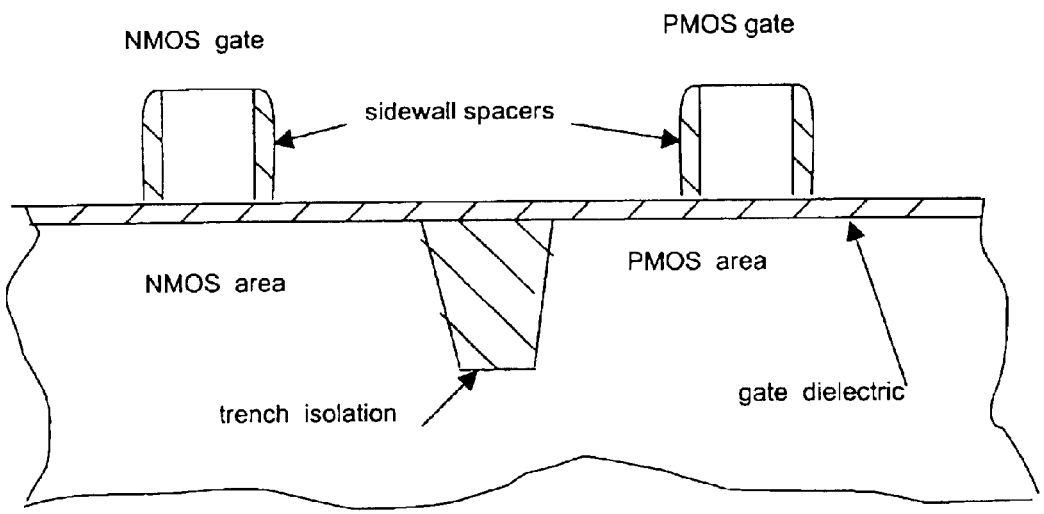

Complete front-end device processing by forming lightly-doped extensions, sidewall spacers, highly-doped source and drain regions, and slicide areas; see FIG. 1e.

(8) Interlevel Dielectric

Figure 1F:
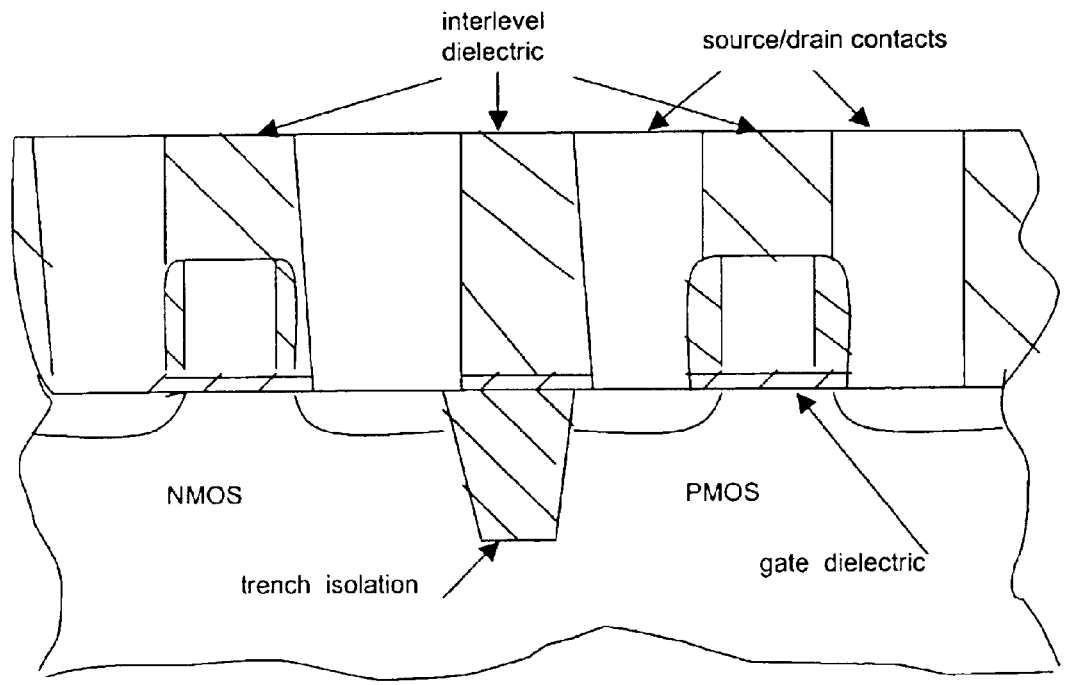

Deposit and planarize an interlevel dielectric layer on the gates, sidewall spacers, and gate dielectric in between. The interlevel dielectric could be a doped (for gettering) silicon dioxide or silicon nitride or a stack of various dielectrics. Next, apply photoresist and pattern it to define source/drain and gate contacts. Then etch vias through the interlevel dielectric and subsequently exposed gate dielectric using the photoresist pattern. Lastly, fill the vias by deposition and etchback of a conductor such as polysilicon or a metal such as tungsten with a TiN barrier layer. This forms the source/drain contacts as illustrated in FIG. 1f.

3. Disposable Gate Preferred Embodiments

Figure 2A:
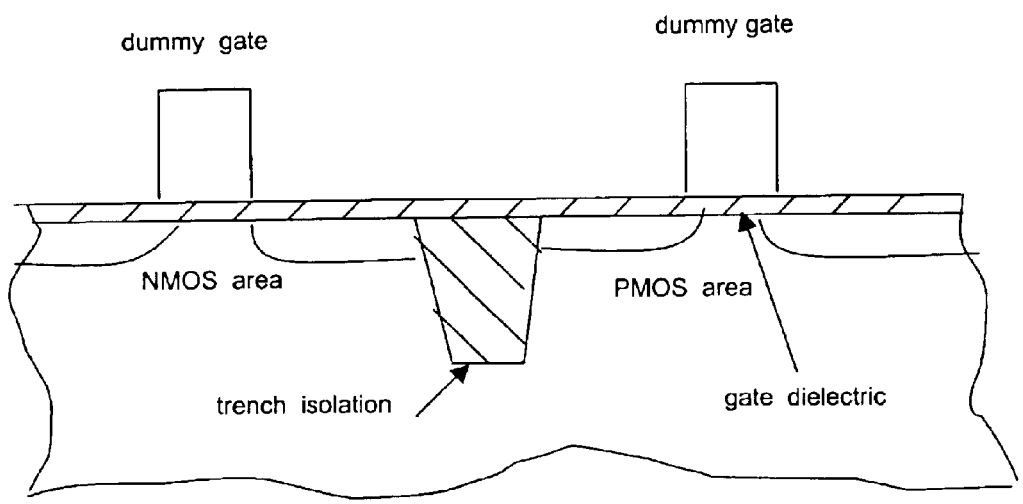
FIGS. 2a–2c are cross sectional elevation views of steps of another preferred embodiment.
Figure 2B:
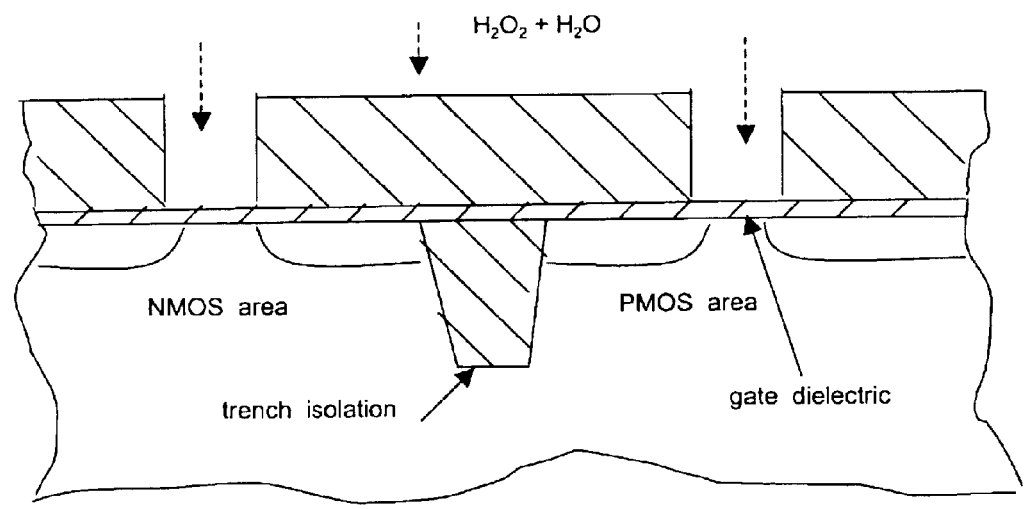
Figure 2C:
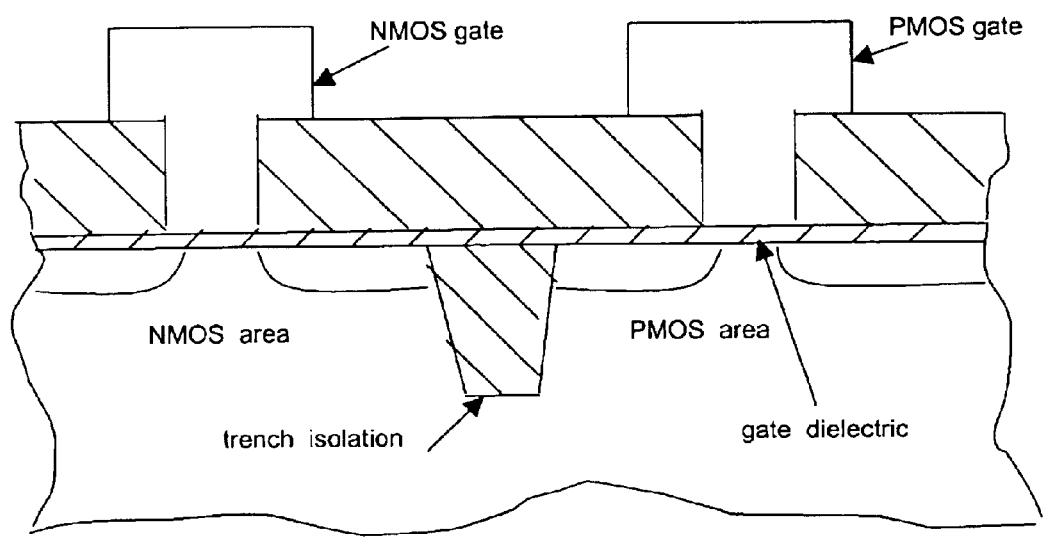

FIGS. 2a–2c illustrate a disposable gate method of integrated circuit fabrication which uses the high-k gate dielectric. In particular, follow the foregoing steps (except the gate dielectric liquid-based oxidation could be deferred) to have a polysilicon disposable (dummy) gate with or without sidewall spacers and source/drains formed in the substrate; see FIG. 2a.

Deposit 200 nm thick dielectric, such as TEOS oxide, and planarize, such as by CMP, to expose the top of the polysilicon dummy gate. The dummy gates may be about 200 nm high and 50 nm long.

Etch out dummy gate with an HBr+$O_2$ plasma which stops on the high-k gate dielectric and forms grooves in the dielectric. At this point apply the preferred embodiment liquid-based oxidation of the high-k gate dielectric as described in foregoing step (5); see FIG. 2b.

Next, blanket deposit gate material, such as polysilicon, metals, alloys, silicides, etc. to fill the groove plus cover dielectric.

Then pattern and etch the gates; see FIG. 2c showing 200 nm thick metal T-shaped gate material.

Alternatively, the original gate dielectric could have been silicon dioxide and after the removal of the polysilicon dummy gate, strip the original gate dielectric and deposit a new 7 nm thick high-k gate dielectric at the bottom of the groove left by the removal of dummy gate. This also deposits roughly 7 nm of high-k on the sidewalls to shorten the eventual gate to 34 nm. Next, apply the preferred embodiment liquid-based oxidation to the high-k gate dielectric as previously described in step (5). Then deposit gate material and proceed as before.

4. Modifications

The preferred embodiments can be modified in various ways while retaining the features of liquid-based oxidation of a high-k gate dielectric.

For example, the composition of the gate dielectric could be varied with Zr, La, Gd, Pr, Y replacing Hf. The ratio of metal to Si could be changed to range from the pure metal oxide (eg. $HfO_2$) to a very dilute alloy (eg Si:Hf ratio of ~10:1). Additionally, the Si could be replaced by Al, forming $M_wAl_xO_yN_z$ as the gate dielectric material.

More, the gate dielectric could be $SiO_xN_y$.

What is claimed is:

1. A method of fabrication of field effect transistors, comprising:

(a) forming a dielectric layer on a semiconductor substrate, said dielectric layer including $M_4Si_4O_yN_z$ with M a metal selected from the group consisting of Hf, Zr, La, Gd, Pr, Y, and mixtures thereof, wherein w>0 and y>0;

(b) oxidizing the dielectric layer by exposing said dielectric layer to an oxidizing liquid solution; and (c) forming gates on said dielectric layer after said exposing of step (b).

2. The method of claim 1, wherein:

(a) said exposing of step (b) of claim 1 is by immersing said dielectric layer and substrate in said liquid solution.

3. The methods of claim 1, wherein:

(a) said exposing of step (b) of claim 1 is by spraying in said liquid solution onto said dielectric layer.

4. The method of claim 1, wherein:

(a) said solution is $H_2O_2$ plus $H_2O$.

5. The method of claim 1, wherein:

(a) said solution is taken from the group consisting of $H_2SO_4+H_2O_2+H_2O$, $H_2SO_4+H_2O$, $HNO_3+H_2O$, $HCl+H_2O_2+H_2O$; $NH_4OH+H_2O_3+H_2O$; and $H_2O+O_3$.

6. The method of claim 1, further comprising the step of:

(a) after said exposing of step (b) of claim 1 but prior to said gate forming step (c) of claim 1, annealing said dielectric layer in an inert atmosphere.

7. The method of claim 1, further comprising the step of:

(a) after said forming of step (a) of claim 1 but prior to said (b) of claim 1, annealing said dielectric layer in an inert atmosphere.

8. The method of claim 1, wherein:

(a) M is Hf; and (b) the ratio of x to w is in the range of 0 to 10.

\* \* \* \* \*

UNITED STATES PATENT AND TRADEMARK OFFICE
CERTIFICATE OF CORRECTION

PATENT NO. : 6,797,599 B2
DATED : September 28, 2004
INVENTOR(S) : Mark R. Visokay, Antonio L. P. Rotondaro and Luigi Colombo It is certified that error appears in the above-identified patent and that said Letters Patent is hereby corrected as shown below:

Column 6,
Line 2, delete "$M_4Si_4O_yN_z$" and insert -- $M_wSi_xO_yN_z$ --.

Signed and Sealed this

Twenty-eighth Day of June, 2005

JON W. DUDAS
*Director of the United States Patent and Trademark Office*